2,965,519

METHOD OF MAKING IMPROVED CONTACTS TO SEMICONDUCTORS

Howard Christensen, Springfield, N.J., assignor to Bell Telephone Laboratories, Incorporated, New York, N.Y., a corporation of New York No Drawing. Filed Nov. 6, 1958, Ser. No. 772,185

6 Claims. (Cl. 117—227)

This invention relates to a method of making electrically conducting contacts on a body, and relates specifically to a method of making electrically conducting contacts on a body of semi-conducting material.

As is known, a large number of electrical devices made from semiconducting materials such as silicon and germanium are now manufactured annually. One of the problems arising in the fabrication of these devices is that of making good electrical contact to the semi-conductor materials in affixing electrodes to the devices.

One technique now in use in such manufacture is the application of a gold electrode to the material. By heat treatments gold is alloyed with the semiconducting material of the base to provide a physically firm and electrically satisfactory contact. The gold bonding technique now popular in the art involves the application of a thin gold film to the semiconductor surface, as by evaporation. The coated body is then heated to alloy the gold with the base material. Surface tension and other forces tend to cause the liquid gold alloy formed during heating to agglomerate into microscopic spherical particles on the surface. Because of the discontinuous nature of the surface presented by the agglomerated alloy on cooling, a second thin gold film is generally applied to the surface to connect the disconnected alloy particles. In this manner the high electrical resistance of the dispersed particles is significantly reduced.

By the method of the present invention, a thin film of gold is first applied to a semiconductor surface to which contact is to be made. A thin film of an oxide of bismuth is then laid over the gold film by evaporation of bismuth trioxide, $Bi_2O_3$. A second film of gold may then optionally be laid over the oxide, if desired, but such a second gold film is unnecessary.

Upon heating the resultant filmed body to a temperature sufficient to alloy the gold with the base material, the oxide of bismuth present promotes formation of a smooth low-resistance surface layer of alloyed gold suitable for electrical purposes such as joining lead wires thereto. The oxide of bismuth is believed to act as a wetting agent for the gold-semiconductor alloy present at the surface of the body when heated to temperatures above the eutectic temperature during the alloying process.

The use of oxide films from evaporation of bismuth trioxide to promote the adherence of gold films to glass substrates is known in the art. The book "Vacuum Deposition of Thin Films" by Holland, John Wiley & Sons, Inc., New York, 1956, describes at pages 237, 504–508, and 513, the use of such oxide layers on glass, before deposition of a gold film on the glass, to promote adherence and good conductivity properties in the gold film. Employing evaporated $Bi_2O_3$ as a substrate on glass differs materially in several respects from its use in the present invention. In the prior art the oxide is used as a substrate; in the present invention it is employed as an overlayer, since non-conducting oxides between the contact metal and the base would interfere with, rather than promote, good electrical conductivity. Prior art uses have involved gold on insulating substrates; in the present invention a semi-conducting substrate is used, to which the making of electrical contact by the gold is essential. Most importantly, prior art uses have involved gaseous and solid phases solely; in the present invention, the efficacy of the oxide is related to its properties in interaction with a liquid phase—the gold semi-conductor alloy at temperatures above the eutectic temperature.

The invention is particularly applicable to germanium and silicon semiconducting material as bases. The materials may be priorly treated according to methods known in the art to have electrical properties suitable to the devices being constructed. Either n-type, p-type, or intrinsic semi-conducting material can be used. Metallic bismuth is known as a doping agent for making n-type semiconductors, but the oxide of bismuth is inactive in this respect. The method herein described does not use conditions under which bismuth oxides are significantly reduced to the metallic state. If such conditions were to be used, the method could still be conveniently employed with n-type semiconducting materials.

Application of a gold film to the base material may be done by any of the known methods for forming thin layers, e.g., by sputtering, plating, or evaporation. Because it is performed in vacuum where extraneous contamination is at a minimum, evaporation of gold onto the base material is a preferred, but not essential, technique. Apparatus design is not critical and conventional commercial evaporating equipment can be conveniently employed. Evaporation of gold from a tungsten wire has been particularly successful. A gold layer between 1500 Angstrom units and 10,000 Angstrom units in thickness is suitably used. The amount of solid gold to be used for forming a film of this thickness can be calculated, as known in the art, from the geometry of the evaporating apparatus.

Heating of the semiconductor surface prior to or during the evaporation is not required, but is permissible if heating is desired for other reasons. The temperature of the semi-conductor should not exceed the eutectic temperature for gold and the semiconductor however.

Because of the relatively thin layers of oxide which are preferred, application of the oxide layer is most conveniently done by evaporation. Again, apparatus now common in the art is suitable, and it is convenient to evaporate the bismuth trioxide immediately subsequent to evaporation of the gold layer, though not necessary. A platinum boat to hold the trioxide has been especially convenient in evaporation. The oxide layer is preferably kept between 35 Angstrom units and 500 Angstrom units thick. For layers about 50 Angstrom units thick, amounts of bismuth trioxide of about one milligram have been used, but as mentioned for gold, the quantity is dependent on the specific geometry of the evaporating apparatus used. With the small quantities of bismuth trioxide, visual monitoring of the evaporation may be difficult. At a temperature of 1200° centigrade, which is sufficient for complete evaporation of the trioxide, a quantity of gas is liberated, which gas can be conveniently monitored by a pressure gauge in the evaporator. It is speculated that the gas may be formed in a partial decomposition of the bismuth trioxide, but may also be adsorbed gas released by heating the compound.

After application of the oxide, a second gold layer within the same thickness range as the first may be optionally evaporated onto the oxide film. Such a layer can conveniently be used if thicker gold layers are desired to decrease still further electrical resistance in the finished contact, but are not essential to the practice of the invention.

When evaporation of the gold layer or layers and the oxide layer is completed, the coated base is next heated to alloy the gold with the semi-conducting material of the base. Alloying is effected by heating to a sufficiently high temperature for formation of the gold-semiconductor eutectic. The composition is present as a liquid phase during the alloying process, and it is the effect on this liquid phase of the oxide present which is responsible for the salutary contacts produced. "Balling up" of the alloy on the semi-conductor is inhibited. A smooth low-resistance alloy film is produced in one step, and no further treatment after alloying is required.

Heating may be accomplished by any feasible methods known in the art. For example, the coated samples may be alloyed by placing them within a metal block preheated to the proper temperature. It has been found especially convenient to alloy the coated samples within the evaporating apparatus itself. A resistance heater is mounted in the neighborhood of the samples and after evaporation is brought to temperature. Radiant heat from the resistance coil alloys the samples.

In alloying, a temperature above the eutectic temperature for the gold-semiconductor alloy formed is used. For gold-germanium, the eutectic temperature is reported at 356° centigrade. For gold-silicon the determinations reported conflict slightly, but a temperature of about 370° centigrade seems most accurate.

Alloying temperatures and times are interrelated variables, but for germanium the alloying temperature will be in the range between 356° centigrade to 390° centigrade and for silicon between 370° centigrade and 400° centigrade. For germanium, a preferred temperature range is between 356° centigrade and 375° centigrade, with an optimum at 365° centigrade. For silicon, a preferred range is between 370° centigrade and 385° centigrade, with an optimum at 378° centigrade.

Alloying times may run between five minutes and ten seconds, depending on temperature, the longer heating times being used at lower temperatures in the above specified ranges, and vice versa. What is desirable in the alloying process is use of a sufficiently high temperature for formation of a gold-semiconductor alloy in the liquid phase (a temperature above the eutectic temperature). Because of the thinness of the metal films used, alloying is almost immediate at temperatures above the eutectic temperature. The time for which the alloy is present as a liquid phase preferably is kept as short as feasible to minimize possible shrinkage of the liquid films at the edges.

Alloying may be carried out in vacuum or in an atmosphere. The functioning of the method itself is independent of the nature of the atmosphere, but other considerations may apply. For example, the use of oxidizing atmospheres during firing may cause undesirable oxidation of the semiconducting base materials, and such atmospheres are generally avoided for this reason. Very strongly reducing conditions may not be desirable when intrinsic or p-type material is fired, because of the possibility of n-doping by bismuth formed from reduction of oxides present. However, a reducing atmosphere of hydrogen has been used in the alloying step with success. Neutral atmospheres of nitrogen or one of the rare gases are also acceptable. Because of the short heating times and comparatively low alloying temperature, interfering chemical reactions between firing atmospheres and the materials used in practicing the method are not a serious problem. The method is, thus, indifferent to the atmospheres used.

The practice of the invention herein described can be illustrated by the following specific example.

A wafer of n-type germanium, acid etched, rinsed in water, and blotted dry was mounted in conventional evaporating apparatus. Two sources were mounted in the apparatus: a one-inch length of 99.999 percent pure gold wire 25 mils in diameter fused on a 60 mil diameter tungsten heater was used as one source, and 340 micrograms of $Bi_2O_3$ in a platinum boat as a second source.

The gold was flashed onto the mounted germanium base. Heating current was then passed in stepwise fashion through the platinum boat until substantially all of the $Bi_2O_3$ had been evaporated. The wafer had a coating, calculated by weighing a glass plate subjected to the same coating procedure, about 1800 Angstrom units in thickness. Of this the gold layer was about 1700 Angstrom units thick and the evaporated oxide about 100 Angstrom units thick.

The wafer was then heated for 30 seconds at 366° centigrade in a hydrogen atmosphere to alloy the applied gold.

Although specific embodiments have been herein shown and described, they are not to be limiting on the scope and spirit of the invention.

What is claimed is:

1. The method of making an electrically conducting contact on a material which is a member of the group consisting of germanium and silicon, which method comprises depositing a layor of gold between 1500 Angstrom units and 10,000 Angstrom units in thickness on the surface of said material, depositing bismuth trioxide to form a layer of oxide between 35 Angstrom units and 500 Angstrom units thick over said gold layer, and then heating the resultant body at a temperature sufficiently above the eutectic temperature for gold and said material and below the melting point of said material, whereby gold is alloyed with said material.

2. The method according to claim 1 wherein said material is germanium.

3. The method according to claim 1 wherein said material is silicon.

4. The method of making an electrically conducting contact on a material which is a member of the group consisting of germanium and silicon, which method comprises evaporating a layer of gold between 1500 Angstrom units and 10,000 Angstrom units in thickness on the surface of said material, evaporating bismuth trioxide to form a layer of oxide between 35 Angstrom units and 500 Angstrom units over said gold layer, and then heating the resultant body at a temperature sufficiently above the eutectic temperature for gold and said material and below the melting point of said material, whereby gold is alloyed with said material.

5. The method according to claim 4 wherein said material is germanium.

6. The method according to claim 4 wherein said material is silicon.

References Cited in the file of this patent

UNITED STATES PATENTS 2,556,991 Teal ------------------ June 12, 1951

OTHER REFERENCES

Holland: "The Vacuum Deposition of Thin Films." John Wiley & Sons, Inc., New York, 1956, pages 237, 504–508, and 513 relied on. (Copy in Div. 25 and in Scientific Library.)